United States Patent [19]

Horiguchi et al.

[11] Patent Number: 4,799,193

[45] Date of Patent: Jan. 17, 1989

[54] SEMICONDUCTOR MEMORY DEVICES

[75] Inventors: Fumio Horiguchi; Yasuo Itoh, both of Kawasaki; Mitsugi Ogura; Masaki Momodomi, both of Yokohama, all of Japan

[73] Assignee: Kabushiki Kaisha Toshiba, Kawasaki, Japan

[21] Appl. No.: 917,042

[22] Filed: Oct. 9, 1986

[30] Foreign Application Priority Data

Oct. 9, 1985 [JP] Japan ................................ 60-225353

[51] Int. Cl.[4] ........................................... G11C 11/24
[52] U.S. Cl. .................................... 365/149; 365/189
[58] Field of Search .................. 365/149, 189, 203

[56] References Cited

U.S. PATENT DOCUMENTS 4,491,936  1/1985  Eaton, Jr. et al. ................... 365/149
4,520,466  5/1985  Mashiko ............................... 365/210
4,593,382  6/1986  Fujishima et al. .................... 365/149

Primary Examiner—Joseph A. Popek
Attorney, Agent, or Firm—Foley & Lardner, Schwartz, Jeffery, Schwaab, Mack, Blumenthal & Evans

[57] ABSTRACT

A semiconductor memory device having at least one memory cell array block with a plurality of memory cells formed at the surface of a semiconductor substrate. Each memory cell includes a transistor and memory capacitor. The device further has a plurality of word lines for addressing the memory cells, a plurality of bit lines for reading from and writing to the memory capacitors, at least one cell plate formed on the semiconductor substrate, the cell plate forming a common electrode of the memory capacitors, a cell plate voltage generator for supplying a voltage of a level between the supply voltage and the ground voltage to the cell plate, and a control circuit for controlling the output impedance of the cell plate voltage generating unit.

33 Claims, 9 Drawing Sheets

SEMICONDUCTOR MEMORY DEVICES

BACKGROUND OF THE INVENTION

The present invention relates to a semiconductor memory device, in which a plurality of memory cells having storage capacitor are arranged to provide a memory array.

In recent years, semiconductor memory devices have advanced rapidly toward higher and higher integration, especially in the case of dynamic RAMs.

FIG. 1a is a diagram showing a plan view of a conventional cell array of a DRAM, and FIG. 1b is its cross-sectional view along line A-A' of FIG. 1a.

At the surface of a p-type Si substrate 1, a field oxide 2, a capacitor insulator 3 and a cell plate (common capacitor electrode) 4 are formed as shown in FIG. 1b. For the surface of the capacitor area, a n+-region 5 is formed. Also, on a gate insulator 6, a gate electrode 7 (word line) is stacked. The numbers 8 and 9 denote a n+-source and a n+-drain, respectively. Onto the substrate, a CVD SiO$_2$ layer 10 is deposited. A bit line 11 of Al contacts the drain 9 through a contact hole in CVD SiO$_2$ layer 10. The cell plate 4 is expressed as a doted area in FIG. 1a and FIG. 1b.

In such high integrated DRAM devices, the soft-error caused by α-particles has become an intensive problem. Therefore, despite the desire of high integration, in order to assure this soft-error tolerance together with the requirements of enough sensitivity in sense circuits, the amount of storage charge cannot be excessively reduced.

One of the methods to preserve the capacitance of the memory cell, preventing the increase of the real estate per cell, is to make the capacitor insulator thinner. As for the 1M bit DRAM, 100~150 Å of an SiO$_2$ layer is used as the capacitor insulator. However, the dielectric strength of the capacitor insulator becomes a problem if the voltage of the cell plate is set to the ground voltage V$_{ss}$ or to the supply voltage V$_{cc}$. This is because the maximum electric field arising in the capacitor insulator reaches 5 MV/cm. Hence, by using a thinner insulator, it is required that one use a medium voltage, namely ($\frac{1}{2}$) V$_{cc}$, as the cell plate voltage.

FIG. 2a shows the equivalent circuit of the memory cell, and FIG. 2b shows its C-V curve against several cell plate voltages V$_{cc}$. The numeral V expresses the storage voltage. As shown in FIG. 2b, in the case of the ($\frac{1}{2}$) V$_{cc}$, the maximum voltage arising in the capacitor insulator can be maintained at about 2.5 volt in spite of the fact that the memorizing voltage V is kept at 5 volt.

However, along with this technique another problem occurs as is described in the following.

In the cell plate voltage generating circuit, the resistance division construction, is used such that resistors are connected between V$_{cc}$ and V$_{ss}$. With regard to the cell plate voltage generating circuit, in order to prevent malfunction it is necessary to suppress fluctuations of the cell plate voltage which are caused by the capacitor coupling with the cell nodes. In order to accomplish such suppression, it is desirable to reduce the resistivity of the dividing resistors. However, power dissipation increases in the case of resistivity reduction, a clearly undesirable effect.

SUMMARY OF THE INVENTION

Accordingly, an object of the present invention is to provide an improved semiconductor memory device having cell plate voltage generating means.

Another object of the invention is to provide an improved semiconductor memory device for obtaining stable cell plate voltage.

Another object of the inventions is to provide an improved semiconductor memory device for preventing malfunction of the semiconductor memory device while reducing power dissipation.

Still another object of the invention is to provide an improved semiconductor memory device for preventing an accumulation effect of cell plate potential.

In accomplishing the foregoing objects, there is provided according to one aspect of the invention a semiconductor memory device, having at least one memory cell array block with a plurality of memory cells formed at the surface of a semiconductor substrate, each memory cell having a transistor and memory capacitor; a plurality of word lines for addressing the memory cells; a plurality of bit lines for reading from and writing in the memory capacitors; at least one cell plate formed on said semiconductor substrate, the cell plate composing a common electrode of the memory capacitors; cell plate voltage generating means for supplying a voltage of a level between a supply voltage and a ground voltage to the cell plate; and control means for controlling the output impedance of the cell plate voltage generating means.

According to another aspect of the invention, there is provided a semiconductor memory device, comprising a plurality of memory cell array blocks with a plurality of memory cells formed at the surface of a semiconductor substrate, each memory cell having a transistor and memory capacitor, the memory cell array blocks being partially activated; a plurality of word lines for addressing the memory cells; a plurality of bit lines for reading from and writing into the memory capacitors; at least one cell plate formed on the semiconductor substrate, said cell plate composing a common electrode of the memory capacitors; cell plate voltage generating means for supplying a voltage of a level between the supply voltage and the ground voltage to said cell plate; and control means for controlling the output impedance of said cell plate voltage generating means.

BRIEF DESCRIPTION OF THE DRAWINGS

The invention, together with its various features and advantages, will be readily understood from the following more detailed description presented in conjunction with the following drawings in which:

FIG. 1b is its cross-sectional view along line A-A' in FIG. 1a;

FIG. 2b is a diagram showing the C-V curve against several cell plate voltages for the memory cell shown in FIG. 2a;

FIG. 9b is a diagram showing output waveforms of the clock circuit in FIG. 9a;

DETAILED DESCRIPTION OF THE PREFERRED EMBODIMENTS

Figure 3:
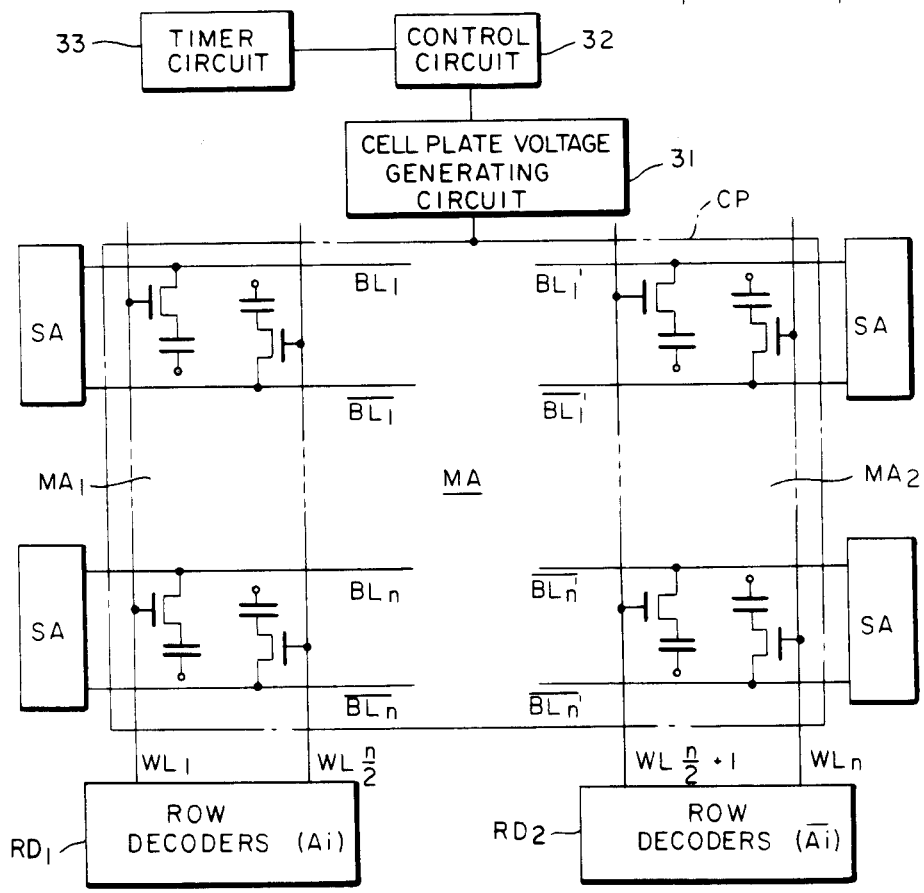
FIG. 3 is a diagram showing a circuit diagram of a dynamic RAM chip in which this invention is applied.

FIG. 3 is a diagram showing a circuit diagram of a dynamic RAM chip of the embodiment.

Figure 1A:
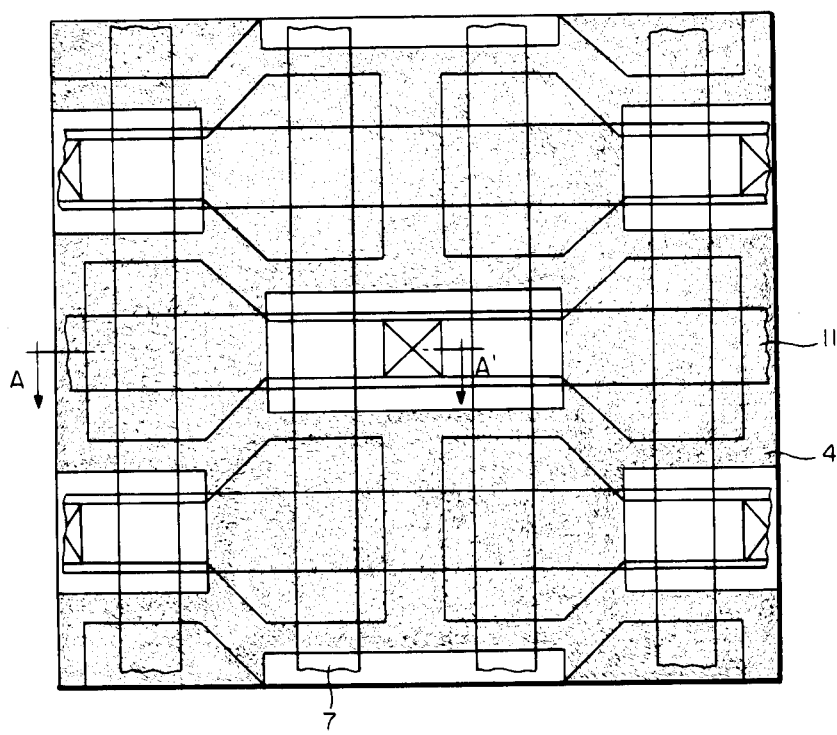
FIG. 1a is a diagram showing a plan view of a conventional cell array of a DRAM.
Figure 1B:
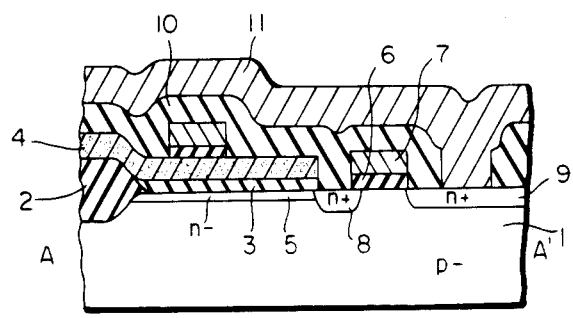
Figure 2A:
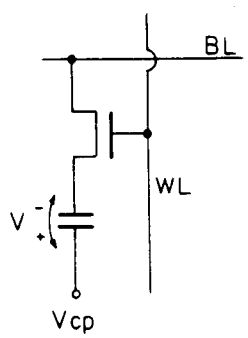
FIG. 2a is a diagram showing the equivalent circuit of the memory cell in FIG. 1a and FIG. 1b.
Figure 2B:
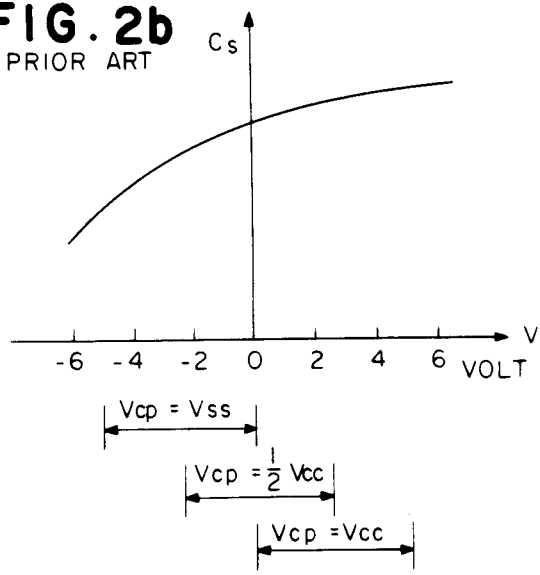

A memory array MA is fabricated at a surface of a semiconductor substrate (p-type Si) by arranging memory cells in a matrix form, each of which is composed of one MOSFET and one capacitor. Numerals $WL_1$,—$WL_n$ are word lines for selectively driving a desired memory cell, and $BL_1$, $\overline{BL_1}$, $BL_1'$, $\overline{BL_1'}$ are bit lines for reading from and writing information into the memory cell. This embodiment shows a so-called folded bit line arrangement. FIG. 3 also shows sense amplifiers SA and row decoders $RD_1$, and $RD_2$. The numeral CP denotes a cell plate formed on the substrate. The cell plate is fabricated as a common capacitor electrode for all memory cells in a memory cell array MA as shown in FIG. 1a and FIG. 1b. Number 31 is a cell plate voltage generating circuit that supplies a predetermined voltage for this cell plate CP. This figure also shows a control circuit 32 and a timer circuit 33. For simplicity, the column decoder is neglected in this drawing. The memory array MA consists of two memory blocks $MA_1$ and $MA_2$, however, both blocks act as a whole.

Figure 4:
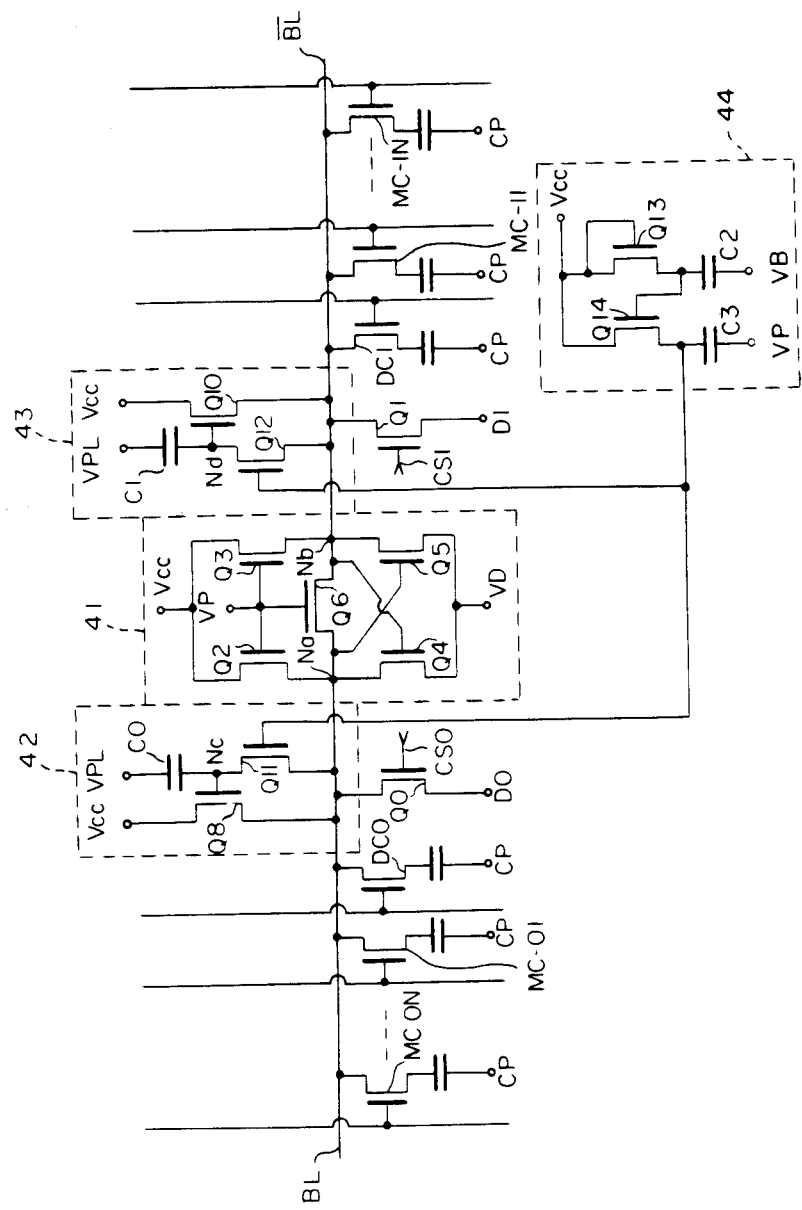
FIG. 4 is a circuit diagram showing one column in the memory array in FIG. 3.

FIG. 4 is a circuit diagram of one column in the memory array in FIG. 3. FIG. 4 expresses the circuit as the deployed form.

The dynamic RAM circuit includes a sense amplifier 41 having a flip-flop circuit, bit lines BL and $\overline{BL}$ connected respectively to nodes Na and Nb of the flip-flop circuit, a dummy cell DC0 and an N number of memory cells MC-01 to MC-0N connected to the bit line BL, and a dummy cell DC1 and an N number of memory cells MC-11 to MC-1N connected to the bit line $\overline{BL}$. The RAM circuit further includes active pull up circuits 42 and 43 connected respectively to the bit lines BL and $\overline{BL}$, and a control circuit 44 for controlling the active pull-up circuits 42 and 43. MOS transistors $Q_0$ and $Q_1$ have their conduction states controlled by respective output signals $CS_0$ and $CS_1$ from a column decoder (not shown), and have their current paths connected respectively between the bit line BL and an I/O terminal $D_0$ and between the bit line $\overline{BL}$ and an I/O terminal $D_1$.

The sense amplifier 41 is comprised of MOS transistors $Q_2$ and $Q_3$ having their current paths connected between a $V_{cc}$ terminal and nodes Na, Nb, respectively, MOS transistors $Q_4$ and $Q_5$ having their current paths connected between the node Na and a drive terminal VD and between the node Nb and the drive terminal VD respectively, and a MOS transistor $Q_6$ having its current path connected between the nodes Na and Nb. The MOS transistors $Q_2$, $Q_3$ and $Q_6$ have their gates connected to a precharge terminal VP, while the MOS transistors $Q_4$ and $Q_5$ have their gates respectively connected to the nodes Nb and Na.

The active pull-up circuit 42 is formed of a MOS capacitor $C_0$ connected between a pull-up terminal VPL and a node Nc, a MOS transistor $Q_{11}$ having a gate connected to the control circuit 44 and having a current path connected between the node Nc and bit line BL, and a MOS transistor $Q_8$ having a gate connected to the node Nc and a current path connected between a terminal $V_{cc}$ and the bit line BL.

The active pull-up circuit 43 is formed of a MOS capacitor $C_1$ connected between the pull-up terminal VPL and a node Nd, a MOS transistor $Q_{12}$ having a gate connected to the control circuit 44 and a current path connected between the node Nd and bit line $\overline{BL}$, and a MOS transistor $Q_{10}$ having a gate connected to the node Nd and a current path connected between the terminal $V_{cc}$ and the bit line $\overline{BL}$. The control circuit 44 is formed of a MOS transistor $Q_{13}$ having its gate and drain connected to the terminal $V_{cc}$, a capacitor $C_2$ connected between a source of the transistor $Q_{13}$ and a control terminal VB to which a control signal $\phi B$ is supplied from a control signal generator (not shown). Control circuit 44 further comprises a MOS transistor $Q_{14}$ having a gate connected to the source of the MOS transistor $Q_{13}$ and having a drain connected to the terminal $V_{cc}$, and a capacitor $C_3$ connected between the source of the transistor $Q_{14}$ and a precharge terminal VP. The source of the MOS transistor $Q_{14}$ is connected, as an output terminal, to the gates of the MOS transistors $Q_{11}$ and $Q_{12}$. The circuit in FIG. 4 uses n-channel MOSFETs.

The DRAM circuit shown in FIG. 4 is described, for example, in U.S. Pat. No. 4,503,343 incorporated herein by reference.

There will now be described the operation of the read cycle mode of the dynamic RAM circuit shown in FIG. 4 with reference to FIGS. 5a to 5h.

Figure 5A:
FIG. 5a through FIG. 5h are timing charts for operating the memory cells shown in FIG. 4.
Figure 5B:
Figure 5C:
Figure 5D:
Figure 5E:

During the standby period, a precharge voltage $\phi P$ shown in FIG. 5a, applied to the precharge terminal VP, is kept at a high level which is equal to or higher than a level ($V_{cc}+V_{th}$) (where $V_{cc}$ represents the supply voltage and $V_{th}$ the threshold voltage of the MOS transistor used), while the word selection signal shown in FIG. 5b is kept at a low level. In this state, the MOS transistors $Q_2$, $Q_3$ and $Q_6$ are kept conductive and the bit lines BL and $\overline{BL}$ are precharged to a high level of $V_{cc}$ as shown in FIG. 5g.

Figure 5F:
Figure 5G:
Figure 5H:

When the precharge signal $\phi P$ has a low level and the control signal $\phi B$ shown in FIG. 4e and supplied to the control terminal VB has a high level, a gate voltage higher than a level ($V_{cc}+V_{th}$) is applied to the gate of the MOS transistor $Q_{14}$, so that an output signal of $V_{cc}$ level shown in FIG. 5f is produced from the control circuit 44. However, when the control signal $\phi B$ is set to a low level and the precharge signal φP is set to a high level, an output voltage signal higher than the level ($V_{cc}+V_{th}$) is produced from the central circuit 44. This high level voltage is kept at the high level until the precharge signal φP is set to a low level. Accordingly, during the standby period, the MOS transistors $Q_{11}$ and $Q_{12}$ are rendered conductive with a result that the potential of the nodes Nc and Nd is kept at the $V_{cc}$ level.

By inputting the $\overline{RAS}$ (row address strobe) signal of a low level to the chip, the precharge signal φP is set to a low level as shown in FIG. 5a, and the active period begins. An output voltage of $V_{cc}$ level is applied to the gates of the MOS transistors $Q_{11}$ and $Q_{12}$ and the reading operation is executed. That is, a word selection signal of a high level shown in FIG. 5b in thereafter supplied to word lines as selected, and the drive signal φD applied to the drive terminal VD is set to a low level as shown in FIG. 5c. The word selection signal is produced from the row address signal consisting of 10 bits, $A_0$, $A_1$, —,$A_9$ which are taken into the chip as the row address strobe $\overline{RAS}$ falls.

Assume now that data "1" was written in the memory cell MC-O1, and word lines respectively connected to the memory cell MC-O1 and the dummy cell $DC_1$ are set at a high level. Then, the potentials of the bit lines BL and $\overline{BL}$ are set to "1" and "0" as shown in FIG. 5g by a solid line and a broken line, respectively. The dummy cell is initially written with a "½" voltage level (using a writing MOS transistor, not shown). In this case, the MOS transistors $Q_{11}$ and $Q_{12}$ are rendered nonconductive and conductive, respectively, and the nodes Nc and Nd are set to "1" and "0" levels, respectively, as shown by a solid line and a broken line in FIG. 5h. When, at this time, the pull-up signal φPL supplied to the terminal VPL is set to a high level as shown in FIG. 5d, the potential at the node Nc is pulled up by the electrostatic capacitive coupling of the MOS capacitor and becomes higher than the $V_{cc}$ level as shown by a solid line in FIG. 5h. Therefore, the MOS transistor $Q_8$ is rendered fully conductive. Since, on the other hand, the potential at the node Nd is a "0" level, it is kept at a "0" level even when the pull-up signal φPL is increased to the high level.

In this way, the potentials of the bit lines BL and $\overline{BL}$ are set to the $V_{cc}$ level and OV level, respectively, and thereafter, in accordance with the column selection signals $CS_0$ and $CS_1$ from a column decoder (not shown), the "1" and "0" level signals on the bit lines BL and $\overline{BL}$ are read from I/O terminal $D_0$ and $D_1$.

Then, the $\overline{RAS}$ signal arises to a high level, initiating the standby period. The word lines turn to a low level, thus a "1" level is restored to the memory cell MC-01, and then, all the bit lines are precharged.

The re-writing to the memory cell MC-01 can be performed by setting the potential of the bit lines BL, $\overline{BL}$ through the terminals $D_0$, $D_1$ before closing the word lines.

Further, DRAMS, have several active cycles, such as an early writer cycle mode, page cycle mode and so forth as is well known, The page cycle mode is performed row by row corresponding to the $\overline{RAS}$ changes.

Figure 6:
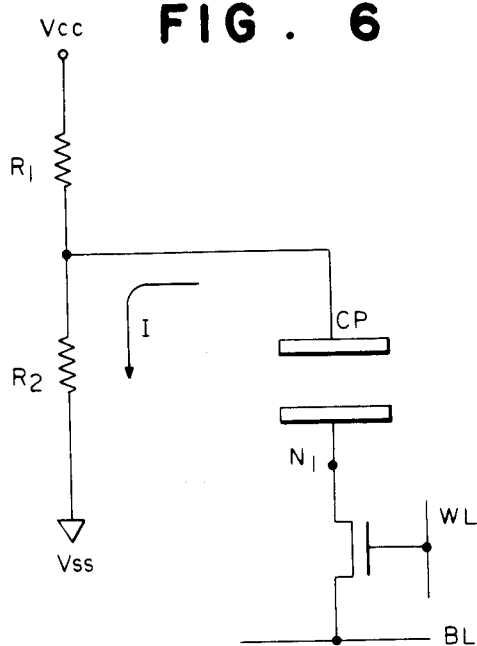
FIG. 6 is a diagram showing an equivalent circuit of a memory cell transistor, a cell plate and dividing resistors.

FIG. 6 is a diagram showing an equivalent circuit of a memory cell transistor T, a cell plate CP and dividing resistors $R_1$ and $R_2$. It is assumed that the voltage of a cell node $N_1$ was reduced from a "H" level to a level near to the intermediate level by the leakage, and the new "H" level is restored to the same memory cell in the read cycle mode. The other sense amplifiers in the activated memory block are also activated, thus, restoring also takes place among the other memory cells along the selected row. The voltage of the cell plate also rises because of the existing capacitor coupling between the cell node and the cell plate CP. In this condition, although the current I flows in the cell plate voltage generating circuit consisting of resistors $R_1$ and $R_2$, cell recovery requires a time period expressed by the time constant CZ, wherein Z is the output impedance of the cell plate voltage generating circuit. The following expression applies:

$$Z = \frac{R_1 \times R_2}{R_1 + R_2}$$

In order to speed up the recovery time, i.e., the time required for the cell plate voltage to return to its normal value (e.g. ½ $V_{cc}$), it is necessary to reduce the value of the output impedance Z.

Figure 7:
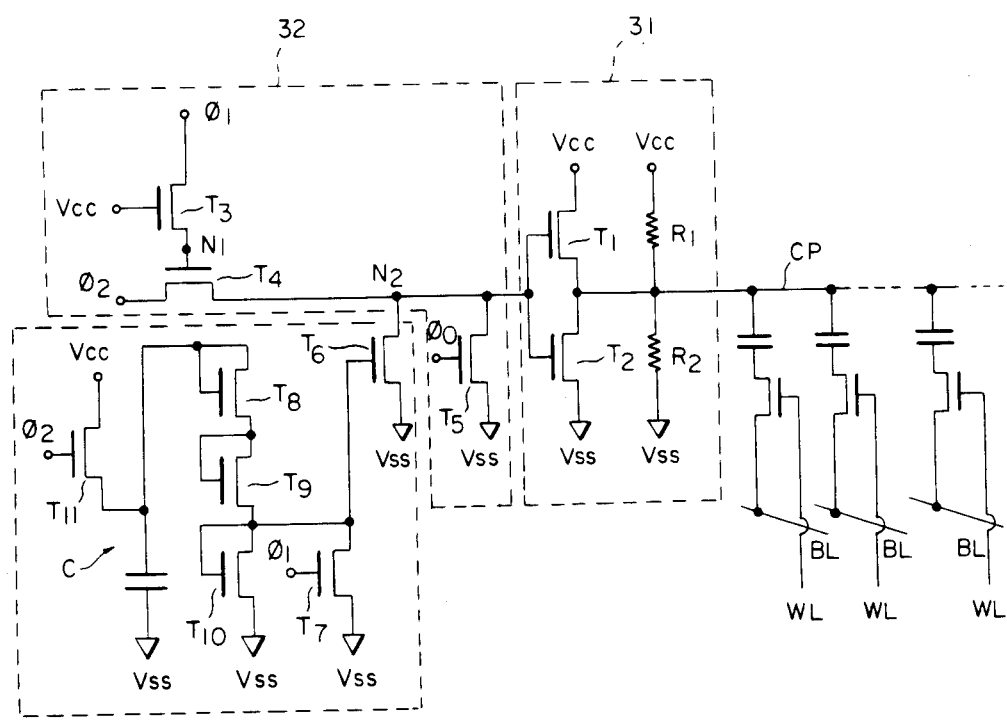
FIG. 7 is a circuit diagram of a cell plate voltage generating circuit, a control circuit and a timer circuit shown in FIG. 3.

FIG. 7 is a circuit diagram of a cell plate voltage generating circuit, a control circuit and a timer circuit is shown in FIG. 3.

Dividing resistors $R_1$ and $R_2$ are connected in series to supply voltage $V_{cc}$ of 5 V and ground voltage $V_{ss}$ of 0 V. These resistors $R_1$, $R_2$ are one component of the cell plate voltage generating circuit 31 supplying the cell plate voltage. In this embodiment, the resistivity of $R_1$ and $R_2$ is equal and is set at 10KΩ.

Therefore, it will be understood the cell plate voltage $V_{cc}$ is (½) $V_{cc}$.

In parallel with the resistors $R_1$, $R_2$, first and second MOSFETs—$T_1$ and $T_2$ are formed as another component of voltage generating circuit 31. The source of $T_1$ and the drain of $T_2$ are connected each other the drain of $T_1$ is connected to $V_{cc}$ and the source of $T_2$ is connected to $V_{ss}$. The gates of MOSFETs—$T_1$ and $T_2$ are commonly connected and controlled by a control circuit 32 consisting of MOSFETS—$T_3$ through $T_5$. The voltage generating circuit 31 generates (½) $V_{cc}$ when activated. The source of the MOSFETs - $T_3$ is connected to the gate of the MOSFET - $T_4$. The MOSFET - $T_4$ is operative for charging the connecting point of gates of MOSFETs - $T_1$ and $T_2$. The drain of the MOSFET - $T_5$ is attached to the connecting point of MOSFETS - $T_1$ and $T_2$.

A timer circuit 33 comprises MOSFETs - $T_6$ through $T_{11}$ and a capacitor C. The timer circuit 33 is operative for returning the output impedance of the voltage generating circuit 31 to the initial value in the case the output impedance has been maintaining at a low impedance state for a predetermined period. This timer circuit 33 is designed so as to operate synchronously with the control circuit 32. The MOSFETs - $T_1$ through $T_{11}$ are n-channel MOSFETs.

Figure 8A:
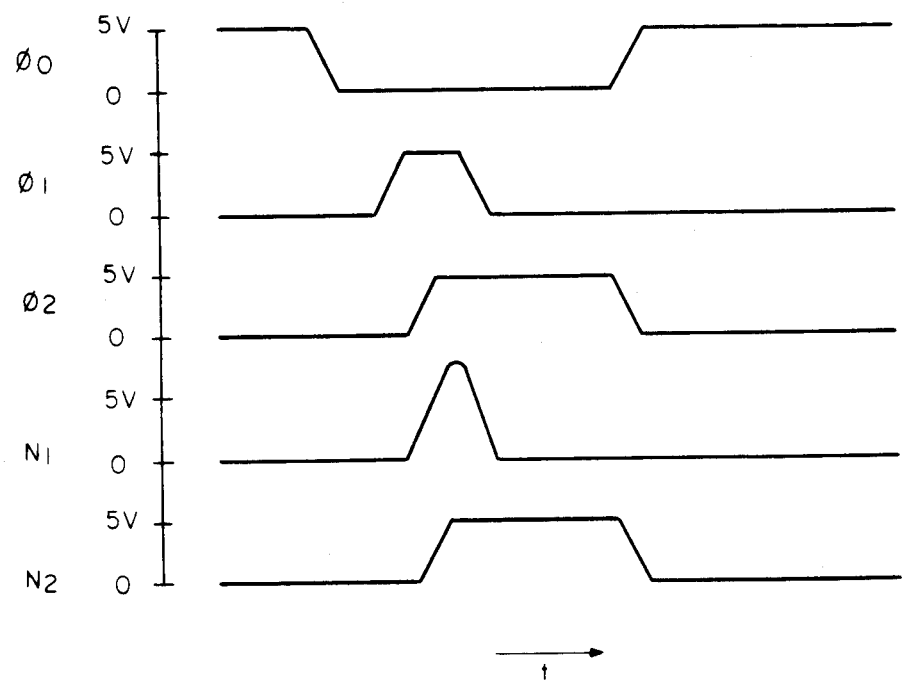
FIG. 8a is a timing chart showing the clocks and the levels of the nodes in FIG. 7.

FIG. 8a is a timing chart showing the clocks and the levels of the nodes in FIG. 7. These clocks $\phi_0$, $\phi_1$ and $\phi_2$ can be supplied as external clocks or may be generated in the chip.

When the memory array MA is in the standby mode, the clocks $\phi_0$, $\phi_1$, and $\phi_2$ are respectively maintained at "H", "L" and "L" levels. At this time, the MOSFETs - $T_5$ and $T_3$ are ON, thereby making nodes $N_1$ and $N_2$ at a low level. Therefore, the MOSFET - $T_1$ and $T_2$ in the cell plate voltage generating circuit 31 are off so that the output impedance of the voltage generating circuit 31 is in a high state, in which the impedance is provided with resistors $R_1$ and $R_2$.

When the memory array MA enters the active period, the clock $\phi_0$ drops, and accordingly, the node $N_2$ becomes floating. Then, together with rising the clock $\phi_1$ to a high level, the node $N_1$ turns to "H". Then, when the clock $\phi_2$ rises to a high level the node $N_1$ rises above the supply voltage $V_{cc}$ because of the source-gate capacitance of MOSFET $T_4$.

Accordingly, the node $N_2$ goes to a "H" level. After that, the MOSFET - $T_4$ turns off. Therefore, the MOSFETs - $T_1$ and $T_2$ turn on, so that the output impedance of the cell plate voltage generating circuit 31 is reduced. Thus, if voltage fluctuations occur in the cell plate, they will be stabilized relatively soon with the aid of the MOSFETs - $T_1$ and $T_2$. As to the MOSFET - $T_1$, $T_2$, it is preferable to establish the ratio of the gate width of MOSFET - $T_1$ to that of MOSFET - $T_2$ at 4.2:1. In a low output impedance state, the MOSFET - $T_1$ acts in an unsaturated region, on the other hand, the MOSFET - $T_2$ acts in a saturated region.

The memory array enters the standby period when the clock $\phi_0$ returns to the high level. The MOSFETs - $T_1$ and $T_2$ turn off as the node $N_2$ is discharged by the MOSFET - $T_5$ turning ON.

Figure 8B:
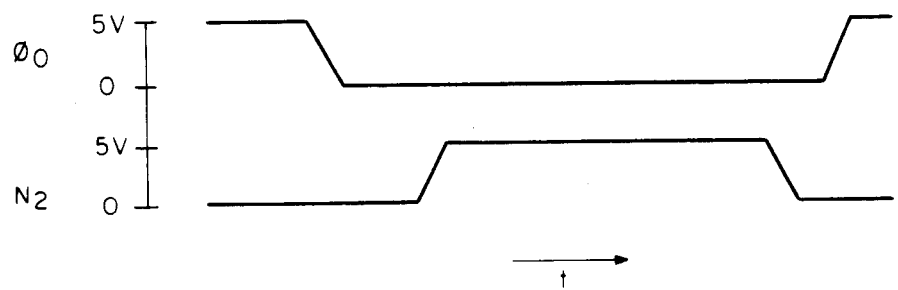
FIG. 8b is a timing chart for describing the operation of a timer circuit.

On the other hand, the timer circuit 33 operates as follows. The gate of the MOSFET - $T_6$ is set at a low level while the clock $\phi_1$ is maintained at a high level. By turning on the clock $\phi_2$, the integrating circuit consisting of the MOSFET - $T_{11}$ and the capacitor C begins to operate and accumulate change. The output voltage of $T_{11}$ is then divided by the MOSFETs - $T_8$ through $T_{10}$, and the divided voltage is supplied to the gate of the MOSFET - $T_6$. Accordingly, the MOSFET - $T_6$ turns on at a predetermined time after clock $\phi_2$ rises to a high level, so that as shown in FIG. 8b, the node $N_2$ becomes low despite the fact that clock $\phi_0$ still maintains a low level.

In the above description, the access signal is used as the clock $\phi_0$.

As for the uses of the DRAM, there are several modes. The read cycle mode and the early-write cycle mode have short active periods; however, the page cycle mode and so forth have relatively long active period. Therefore, the timer circuit 33 is operative to prevent the low output impedance period of the voltage generating circuit 31 from continuing for an excessively long time.

It is preferable to set the time constant $\tau$ of the cell plate voltage generating circuit 31 for a low output impedance such that, $$\tau < T \times 30$$

especially, $$\tau < T \times 10$$

wherein T is the cycle time. The cycle time is defined as the sum of the active period and the standby period which occurs between the active periods and is used for bit line pre-charging. The time constant $\tau$ is expressed as CZ, where C is the capacitance of the cell plate CP and Z is expressed by the formula above.

Figure 9A:
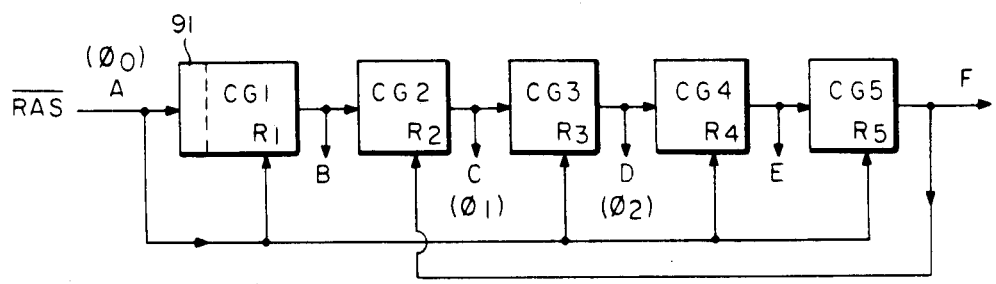
FIG. 9a is a block diagram showing a clock circuit for obtaining clocks $\phi_0$, $\phi_1$, and $\phi_2$ shown in FIG. 7 and FIG. 8.

FIG. 9a is a block diagram showing a clock circuit for obtaining the clocks signals $\phi_0$, $\phi_1$ and $\phi_2$ in FIG. 7 and FIG. 8.

In FIG. 9a, clock generators $CG_1$ through $CG_5$ are connected in series. The clock generator $CG_1$ has an invertor 91 at the input end thereof. Each of the clock generators $CG_1$ through $CG_5$ has a reset terminal. The reset terminals are denoted as the numeral $R_1$ through $R_5$. In FIG. 9a, the method for obtaining the clocks $\phi_1$ and $\phi_2$ with the clock $\overline{RAS}$ ($\phi_0$) will be shown. The row address strobe $\overline{RAS}$ is input to the clock generator $CG_1$, and is also input to the reset terminals $R_1$ and $R_3$ through $R_5$. The output of the clock generator $CG_5$ is fed back to the reset terminal $R_2$. Each clock generator delays the clock for a certain period.

Figure 9B:
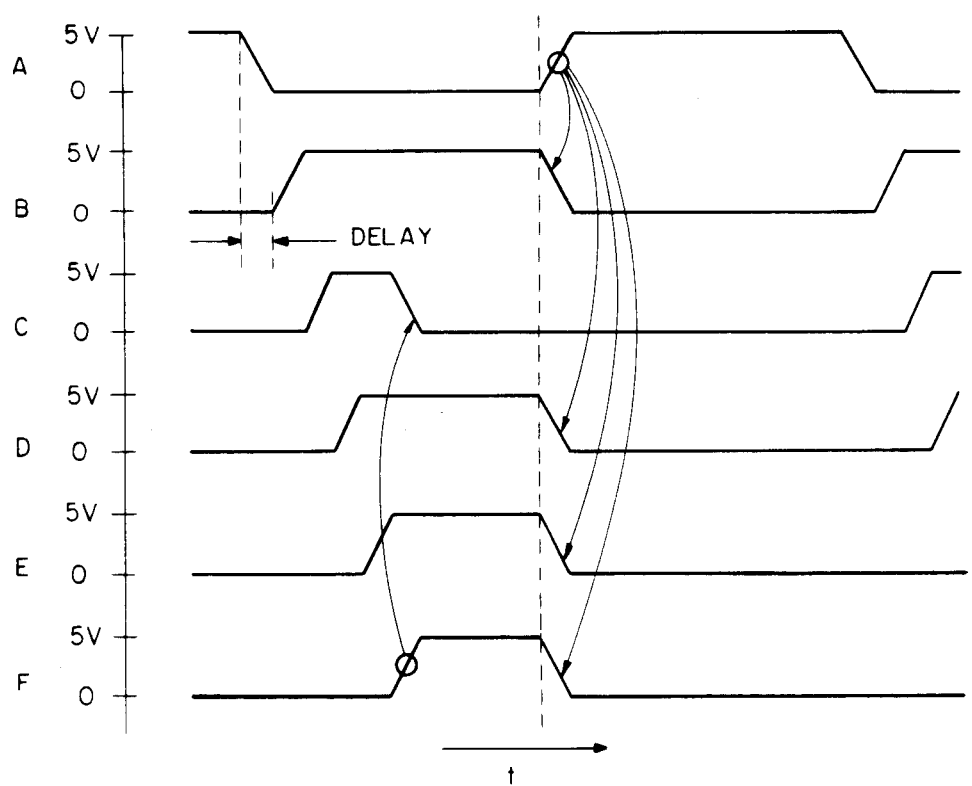

FIG. 9b is a diagram showing output waveforms of the clock generators $CG_1$ through $CG_5$ in FIG. 9a as the numeral A~F. In the waveform of the output waveform B, for instance, the clock is inverted with respect to the $\overline{RAS}$ clock with a certain delay time as shown in the second line, B, of FIG. 9b. However, the delay is removed at the rising edge of $\overline{RAS}$ because of $\overline{RAS}$ is input to the reset terminal $R_1$. In the same manner, the timing of the jabling edge in the outputs D through F are synchronized to the rising edge of the $\overline{RAS}$ clock. In contrast, the falling edge of the output C is synchronized with the raising edge of the output F. This is because the output F is fed back to the reset terminal $R_2$ of clock generator $CG_2$.

As mentioned, the $\overline{RAS}$ clock and the output C, D can be used as the clocks $\phi_0$, $\phi_1$ and $\phi_2$, respectively.

According to the embodiment described above, the leakage current in the standby period can be reduced effectively, and also, the cell plate voltage in the active period can be stabilized.

An accumulation effect is yet another problem which occurs with the operation of dynamic RAMs. For instance, with a large number of activation to the word lines, a voltage potential accumulation on the cell plate, thereby causing large fluctuations in cell plate voltage. These fluctuations result in a loss in reliability of the operation of the dynamic RAM. FOr example, the accuracy of reading out of the cell information, is significantly lessened. This problem can be improved by periodically lowering the output impedance of the cell plate voltage generating circuit 31.

Figure 9C:
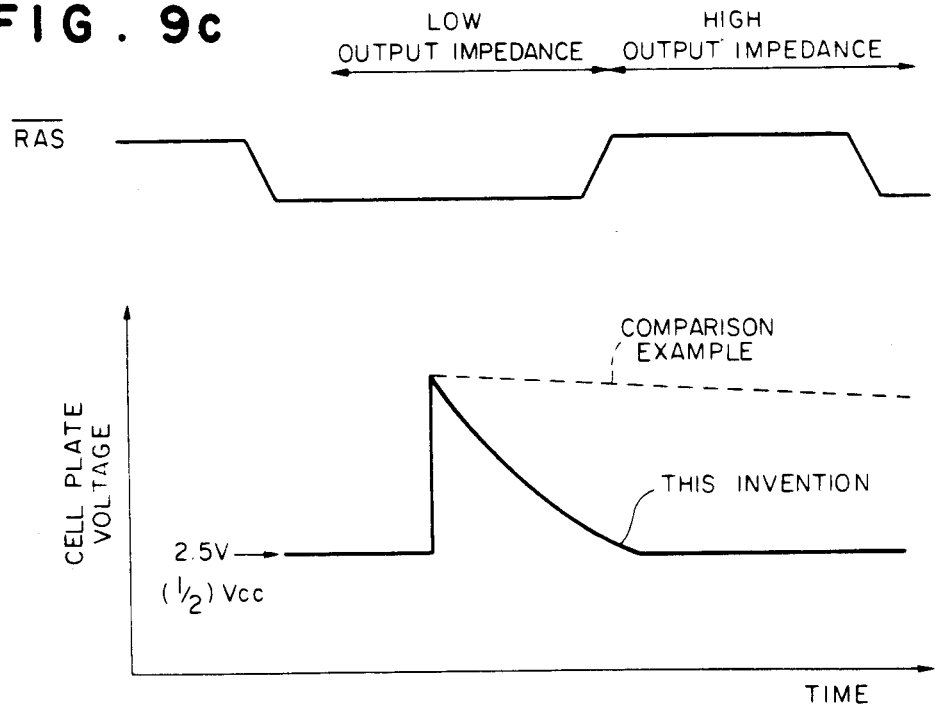
FIG. 9c is a diagram for describing the fluctuation of the cell plate voltage.

FIG. 9c is a diagram showing the fluctuation of the cell plate voltage. As shown in the solid line, the fluctuation is readily recovered in this embodiment. However, in the case the high output impedance is kept, the recovering is much slower as shown in the broken line, thereby, causing undesirable charge accumulation.

Figure 10:
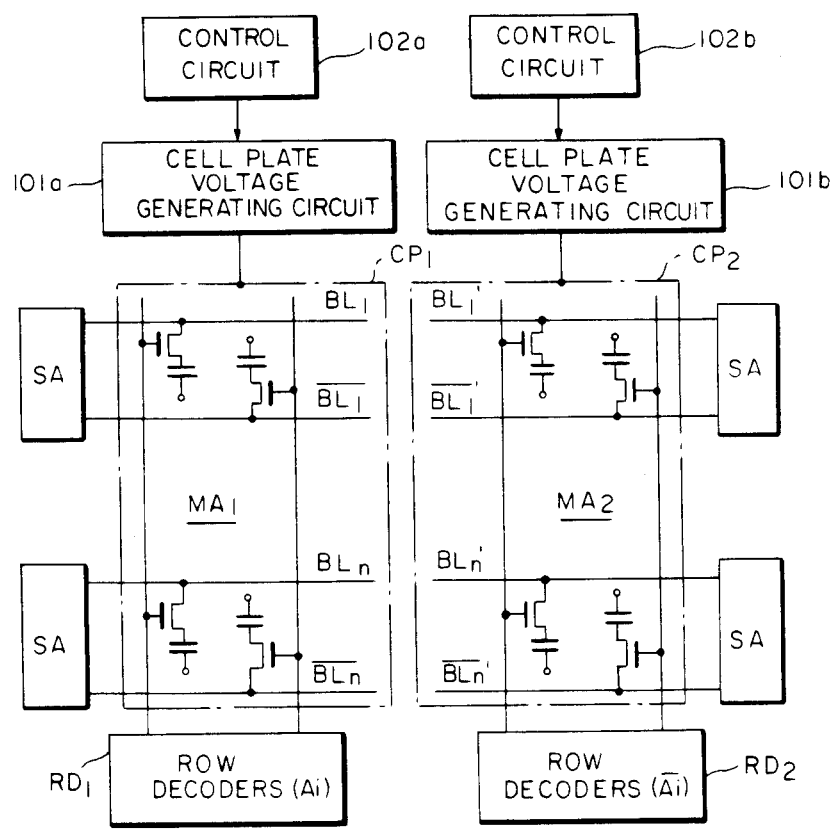
FIG. 10 is a diagram showing a circuit diagram of a dynamic RAM chip in which the invention is applied as another embodiment thereof.

FIG. 10 shows a circuit diagram of a dynamic RAM chip according to another embodiment of the invention.

In FIG. 10, a memory array is divided in two memory array blocks $MA_1$ and $MA_2$, and cell plates $CP_1$ and $CP_2$ are formed correspondingly. For these cell plates, $CP_1$ and $CP_2$, cell plate voltage generating circuits 101a and 101b are provided. The output impedance of the generating circuit 101a, 101b is controlled by control circuits 102a, 102b, respectively. This chip operates in a partial active mode of operation. Namely, the memory array block $MA_1$ of one side is activated when certain inner row address $A_i$, for instance the head bit $A_o$, has a "H" level. During this period, the other memory array block $MA_2$ is in an inactive state for low power dissipation. Namely, the memory array block $MA_2$ maintains its standby state during this period. In a similar fashion, the memory array block $MA_2$ is activated when inner row address $A_i$ has a "H" level, wherein the memory array block $MA_1$ enters an inactive state. Thus, the cell plate voltage generating circuit 101a, 101b are controlled so as to set the activate memory array block to a low output impedance state, and to set the inactive memory array block to a high output impedance state. The inner row address is produced with address buffer circuits which convert the input row address $A_{in}$ to a pair of complementary signals of $A_i$ and $\overline{A_i}$ (i=0~9), respectively.

Figure 11A:
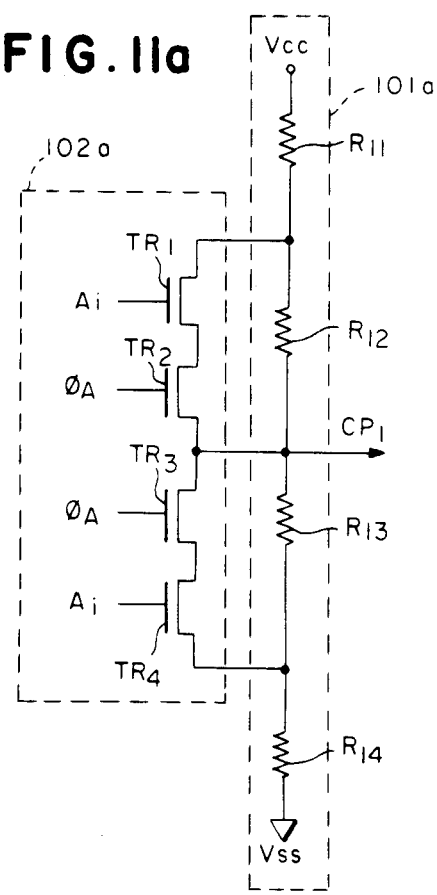
FIG. 11a and FIG. 11b are circuit diagrams each showing the cell plate voltage generating circuit and the control circuit of FIG. 10.
Figure 11B:
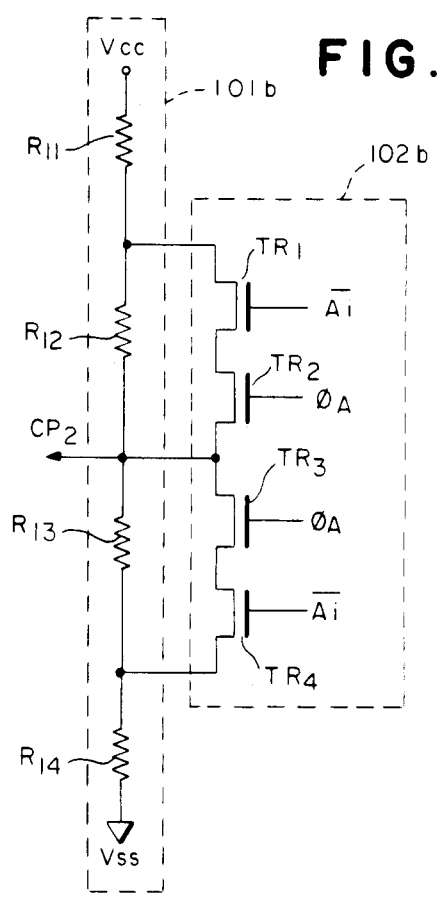

FIG. 11a is a circuit diagram showing the cell plate voltage generating circuit 101a and its control circuit 102a as in FIG. 10. FIG. 11b is circuit diagram showing the cell plate voltage generating circuit 101b and its control circuit 102b as in FIG. 10.

Between $V_{cc}$ and $V_{ss}$, for resistors $R_{11}$, $R_{12}$, $R_{13}$ and $R_{14}$ are connected in series, and cell plate voltage is supplied from the midpoint thereof. The above elements form part of the cell plate voltage generating circuits 101a, 101b. Each of the outer resistors $R_{11}$ and $R_{14}$ has the resistivity of R, and each of the inner resistors $R_{12}$ and $R_{13}$ has a resistivity of 4R. Series connected MOSFETs - $TR_1$ and $TR_2$ are connected across resistor $R_{12}$. Similarly, series-connected MOSFETs - $TR_3$ and $TR_4$ are connected across resistor $R_{13}$. These MOSFETs - $TR_1$ through $TR_4$ may be n-channel MOSFETs. To the gates of the MOSFETs - $TR_2$ and $TR_3$, the clock $\phi_A$ (inverted clock of RAS) is supplied. To the gates of the MOSFET - $TR_1$ and $TR_4$, the corresponding row address signal $A_i$ or $\overline{A_i}$ is supplied as shown in FIG. 11a and FIG. 11b.

According to this embodiment, during the activating period of the memory array $MA_1$, the cell plate voltage generating circuit 101a has a low output impedance because of the shorting the resistors $R_{12}$ and $R_{13}$ with MOSFETs - $TR_1$ through $TR_4$ of the control circuit 102a, in which the signals $\phi_A$ and $A_i$ are both at a "H" level. The other cell plate voltage generating circuit 101b has a high output impedance state because of the "L" level of the signal $A_i$, thereby preventing leakage current.

The other case in which the address signal $A_i$ is "L" and $\overline{A_i}$ is "H" reverses the above relationship.

This invention is not restricted to the embodiments described above. For instance, the low output impedance was achieved in active period in the embodiment in FIG. 3; however, if desired, one can lower the output impedance in the standby period and return to the high impedance in active period. For the embodiment shown in FIG. 7, this reversal may be achieved by using the clock $\phi_0$, $\phi_1$ and $\phi_2$ shown in FIG. 12.

Figure 12:
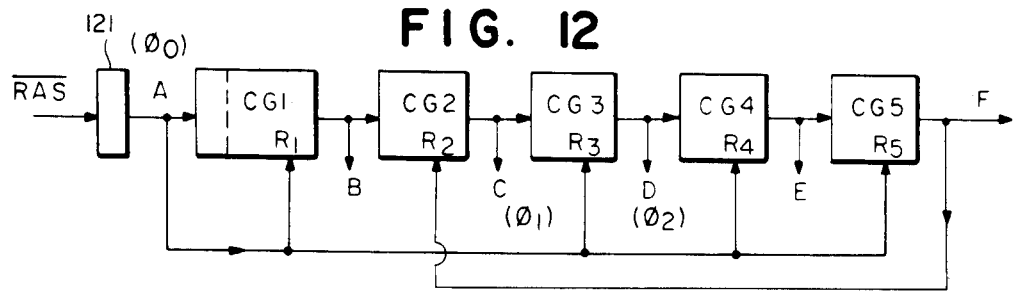
FIG. 12 is a block diagram showing a clock circuit for obtaining the clock $\phi_0$, $\phi_1$ and $\phi_2$ activated in a standby period.

FIG. 12 is a block diagram showing a clock circuit for obtaining the clock $\phi_0$, $\phi_1$ and $\phi_2$ activated in the standby period. In FIG. 12, the basic construction is the same as compared with FIG. 9a; however, an invertor 121 is added in front of the clock generator $CG_1$. Therefore, the same waveforms $\phi_0$ through $\phi_2$ are obtained in the standby period.

A similar operation as in the embodiment of FIG. 11a and FIG. 11b can be obtained by exchanging the address signals $A_i$, $\overline{A_i}$ input to the MOSFETs $TR_1$ and $TR_2$ with each other.

In the case the partial activation method is adopted in the embodiment of FIG. 3, the foregoing discussion is applicable except that, when one of the memory blocks is in an active mode (period), the memory array, consists of $MA_1$ and $MA_2$, is defined to be in an active mode. On the other hand, when none of the memory blocks is in the active mode, the memory array is defined to be in a standby mode. The cell plate is common over two blocks in this case.

Figure 13:
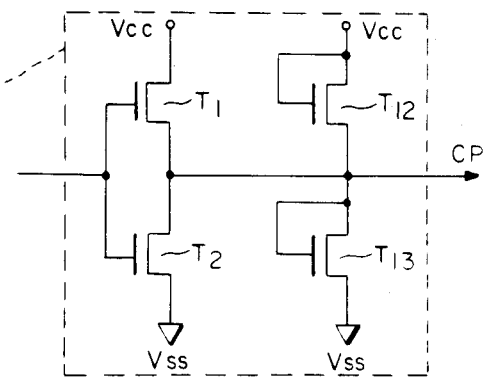
FIG. 13 is a diagram showing another embodiment of a cell plate voltage generating circuit shown in FIG. 7.

FIG. 13 is a circuit diagram showing another embodiment of a cell plate voltage generating circuit shown if FIG. 7.

Shown are n-channel MOSFETs - $T_{12}$ and $T_{13}$ in which the gates and drains are connected. These transistors replace the dividing resistors $R_1$ and $R_2$. This type of MOSFET can replace each of the resistors $R_{11}$ through $R_{14}$ shown in FIG. 11a and FIG. 11b as well.

Furthermore, the cell plate voltage is not limited to ($\frac{1}{2}$) $V_{cc}$, but other appropriate voltages between $V_{cc}$ and $V_{ss}$ may be applied. Further, in the embodiment of FIG. 10, the memory array is divided to two regions but in operation, it may be divided into further blocks. For instance, in case there are four memory cell array blocks, one or two memory cell array blocks may be activated at the same time in the active period.

Other modifications and improvements of the invention will also become apparent to these of skill in the art, and the invention is intended to cover such modifications and improvements as defined by the appended claims.

What is claimed is:

1. A semiconductor memory device, comprising:
   at least one memory cell array block with a plurality of memory cells formed at the surface of a semiconductor substrate, each memory cell comprises a transistor and memory capacitor;
   a plurality of word lines for addressing said memory cells;
   a plurality of bit lines for reading from and writing to said memory capacitors;
   at least one cell plate formed on said semiconductor substrate, said cell plate forming a common electrode of said memory capacitors;
   cell plate voltage generating means for supplying a voltage of a level between a supply voltage and a ground voltage to said cell plate; and
   control means for controlling an output impedance of said cell plate voltage generating means,
   wherein said output impedance of said cell plate voltage generating means is lowered for a predetermined period, and a time constant of the cell plate voltage generating means during said predetermined time is smaller than thirty times as a cycle time of said memory cells.

2. A semiconductor memory device according to claim 1, wherein said cell plate voltage generating means comprising:
   first voltage generating means which divides a voltage difference between said supply voltage and said ground voltage, said first voltage dividing means having an output; and
   second voltage dividing means which divides voltage difference between said supply voltage and said ground voltage, said second voltage dividing means having an output connected to the output of said first voltage dividing means, wherein output impedance of said second voltage dividing means is controlled by said control means, said second voltage dividing means comprising:
   a first MOS transistor having a gate, a source and a drain, said drain connected to said supply voltage; and
   a second MOS transistor having a gate, a source and a drain, said source connected to said ground voltage, said drain of said second MOS transistor connected to the source of said first MOS transistor so as to form an output terminal;

wherein, said gates of said first and second MOS transistors are connected to each other and form a control terminal, said output of said second voltage dividing means is connected to said output of said first voltage dividing means, and a potential of said control terminal is controlled by said control means for controlling output impedance at said output terminal of said second voltage dividing means.

3. A semiconductor memory device according to claim 2, wherein said first voltage dividing means comprising:
first and second resistor means connected in series to said supply voltage and ground voltage.

4. A semiconductor memory device according to claim 2, wherein said control means comprising:
a third MOS transistor;
a fourth MOS transistor for charging said control terminal, the gate of said fourth MOS transistor connected to the source of said third MOS transistor; and
a fifth MOS transistor for discharging said control terminal.

5. A semiconductor memory device according to claim 2, further comprising:
timer means including integrating means for integrating electric charge during lowering of said output impedance; and
a discharging MOS transistor for discharging said control terminal in dependence on the level of said integrated charge in relation to a predetermined amount.

6. A semiconductor memory device according to claim 5, further comprising:
voltage dividing means for dividing the voltage obtained by said integrated electric charge, and supplying same to the gate of said discharging MOS transistor.

7. A semiconductor memory device according to claim 1, wherein said control means lowers said output impedance of said cell plate voltage generating means when said memory cell array block is in an active mode.

8. A semiconductor memory device according to claim 1, wherein said control means lowers said output impedance of said cell plate voltage generating means when said memory cell array block is in a standby mode.

9. A semiconductor memory device according to claim 1, further comprising:
timer means for increasing said output impedance of said cell plate voltage generating means after said control means lowers said output impedance.

10. A semiconductor memory device according to claim 1, wherein
a plurality of said memory cell array blocks are formed, and said cell plate is formed in common to said memory cell array blocks.

11. A semiconductor memory device according to claim 1, wherein said cell plate voltage generating means comprising:
first resistor means, second resistor means, third resistor means and fourth resistor means formed in series between said supply voltage and said ground voltage, wherein the connecting point between said second and third resistor means forms an output.

12. A semiconductor memory device according to claim 11, wherein said control means comprises two shorting means respectively connected (1) between said output and to a point between said first and second resistor means, and (2) between said output and a point between said third and fourth resistor means.

13. A semiconductor memory device according to claim 1, wherein said output impedance of said cell plate voltage generating means is lowered for a predetermined period, and a time constant of the cell plate voltage of said cell plate voltage generating means during said predetermined time is smaller than ten times a cycle time of said memory cell.

14. A semiconductor memory device according to claim 1, wherein
output said impedance of said cell voltage generating means is changed between an active period and a standby period.

15. A semiconductor memory device, comprising:
at least a first and second memory cell array block, each with a plurality of memory cells formed at the surface of a semiconductor substrate, each memory cell comprises a transistor and a memory capacitor, said first memory cell array block being activated and the second memory cell array block being in a standby condition in one state, said first memory cell array block being in a standby condition and said second memory cell array block being activated in another state;
a plurality of word lines for addressing said memory cells;
a plurality of bit lines for reading from and writing into said memory capacitors;
at least one cell plate formed on said semiconductor substrate, said cell plate forming a common electrode of said memory capacitors;
cell plate voltage generating means for supplying a cell plate voltage of a level between a supply voltage and a ground voltage to said cell plate, said cell plate voltage being the same level both for said first and second memory cell array block; and
control means for controlling an output impedance of said cell plate voltage generating means, said control means changes said output impedance of said cell plate voltage generating means during operation.

16. A semiconductor memory device according to claim 15, wherein said cell plate is formed for each said memory cell array block, and said cell plate voltage generating means and said control means are provided for each memory cell array block.

17. A semiconductor memory device according to claim 16, wherein each said cell plate voltage generating means comprises first resistor means, second resistor means, third resistor means and fourth resistor means formed in series between said supply voltage and said ground voltage, wherein the connecting point between said second and third resistor means forms an output, and each said control means comprises a first pair of MOS transistors connected between said output and a point between said first and second resistor means and a second pair of MOS transistors connected between said output and a point between said third and fourth resistor means, wherein each one MOS transistor of said pairs of MOS transistors has a gate input for receiving an activating signal and each other MOS transistor of said pairs of MOS transistors has a gate input for receiving an address signal, and said address signal is complementary between activated memory cell array blocks and standby memory cell array blocks.

18. A semiconductor memory device according to claim 16, wherein said control means lowers the output impedance of said cell plate voltage generating means when a corresponding memory cell array block is in an active state.

19. A semiconductor memory device according to claim 15, wherein said cell plate is formed in common over a plurality of said memory cell array blocks.

20. A semiconductor memory device, comprising:
at least one memory cell array block with a plurality of memory cells formed at the surface of a semiconductor substrate, each memory cell comprises a transistor and memory capacitor;
a plurality of word lines for addressing said memory cells;
a plurality of bit lines for reading and writing to said memory capacitors;
at least one cell plate formed on said semiconductor substrate, said cell plate forming a common electrode of said memory capacitors;
cell plate voltage generating means for supplying a cell plate voltage of a level between a supply voltage and a ground voltage to said cell plate, said cell plate voltage being the same level both for an active period and a standby period of said memory cell array block; and
control means for controlling an output impedance of said cell plate voltage generating means, said control means changes said output impedance of said cell plate voltage generating means between said active period and said standby period.

21. A semiconductor memory device according to claim 20, wherein said cell plate voltage generating means comprising:
first voltage dividing means which divides a voltage difference between said supply voltage and said ground voltage, said first voltage dividing means having an output; and
second voltage dividing means which divides voltage difference between said supply voltage and said ground voltage, said second voltage dividing means having an output connected to the output of said first voltage dividing means, wherein output impedance of said second voltage dividing means is controlled by said control means, said second voltage dividing means comprising:
a first MOS transistor having a gate, a source and a drain, said drain connected to said supply voltage; and
a second MOS transistor having a gate, a source and a drain, said source connected to said ground voltage, said drain of said second MOS transistor connected to the source of said first MOS transistor;
wherein, the gates of said first and second MOS transistors are connected to each other and form a control terminal.

22. A semiconductor memory device according to claim 21, wherein said first voltage dividing means comprising:
first and second resistor means connected in series to said supply voltage and ground voltage.

23. A semiconductor memory device according to claim 21, wherein said control means comprising:
a third MOS transistor;
a fourth MOS transistor for charging said control terminal, the gate of said fourth MOS transistor connected to the source of said third MOS transistor; and
a fifth MOS transistor for discharging said control terminal.

24. A semiconductor memory device according to claim 21, further comprising:
timer means including integrating means for integrating electric charge during lowering of said output impedance; and
a discharging MOS transistor for discharging said control terminal in dependence on the level of said integrated charge in relation to a predetermined amount.

25. A semiconductor memory device according to claim 24, further comprising:
voltage dividing means for dividing the voltage obtained by said integrated electric charge, and supplying same to the gate of said discharging MOS transistor.

26. A semiconductor memory device according to claim 20, wherein said control means lowers said output impedance of said cell plate voltage generating means when said memory cell array block is in an active mode.

27. A semiconductor memory device according to claim 20, wherein said control means lowers said output impedance of said cell plate voltage generating means when said memory cell array block is in a standby mode.

28. A semiconductor memory device according to claim 20, further comprising:
timer means for increasing said output impedance of said cell plate voltage generating means after said control means lowers said output impedance.

29. A semiconductor memory device according to claim 20, wherein
a plurality of said memory cell array blocks are formed, and said cell plate is formed in common to said memory cell array blocks.

30. A semiconductor memory device according to claim 20, wherein said cell plate voltage generating means comprising:
first resistor means, second resistor means, third resistor means and fourth resistor means formed in series between said supply voltage and said ground voltage, wherein the connecting point between said second and third resistor means forms an output.

31. A semiconductor memory device according to claim 30, wherein said control means comprises two shorting means respectively connected (1) between said output and to a point between said first and second resistor means, and (2) between said output and a point between said third and fourth resistor means.

32. A semiconductor memory device according to claim 20, wherein said output impedance of said cell plate voltage generating means is lowered for a predetermined period, and a time constant of the cell plate voltage of said cell plate voltage generating means during said predetermined time is smaller than ten times a cycle time of said memory cell.

33. A semiconductor memory device, comprising:
at least one memory cell array block with a plurality of memory cells formed at the surface of a semiconductor substrate, each memory cell comprises a transistor and memory capacitor;
a plurality of word lines for addressing said memory cells;
a plurality of bit lines for reading from and writing to said memory capacitors;

at least one cell plate formed on said semiconductor substrate, said cell plate forming a common electrode of said memory capacitors;

cell plate voltage generating means for supplying a voltage of a level between a supply voltage and a ground voltage to said cell plate, said cell plate voltage being the same level both for an active period and a standby period; and control means for controlling an output impedance of said cell plate voltage generating means, said control means periodically lowers said output impedance.

* * * * *